United States Patent [19]

Harlan

[11] 4,437,123

[45] Mar. 13, 1984

[54] DYNAMICALLY CONTROLLED HORIZONTAL PEAKING SYSTEM

[75] Inventor: Wayne E. Harlan, Indianapolis, Ind.

[73] Assignee: RCA Corporation, New York, N.Y.

[21] Appl. No.: 373,531

[22] Filed: Apr. 30, 1982

[51] Int. Cl.³ .......................... H04N 5/14; H04N 5/21
[52] U.S. Cl. ..................................... 358/166; 358/167
[58] Field of Search ............................... 358/166, 167

[56] References Cited

U.S. PATENT DOCUMENTS 2,863,943 12/1958 Luther, Jr. ........................... 178/7.3
4,167,749 9/1979 Burrus ..................................... 358/8

OTHER PUBLICATIONS

The copending U.S. patent application of L. Cochran, entitled "Dynamic Coring Circuit", and concurrently filed with the subject patent application, Ser. No. 373,750.
U.S. patent application of Robert L. Shanley, Ser. No. 363,856, filed on Mar. 31, 1982.

*Primary Examiner*—John C. Martin
*Assistant Examiner*—J. Sutherland
*Attorney, Agent, or Firm*—E. M. Whitacre; P. J. Rasmussen; W. H. Meagher

[57] ABSTRACT

In a system for enhancing horizontal detail of a luminance signal, a horizontal peaking signal to be added to the luminance signal is cored with the depth of coring varied in accordance with a coring control potential. To develop the coring control potential, the input luminance signal is capacitively coupled to the input of a signal translator comprising an inverting amplifier with a frequency selective negative feedback path providing the translator with a low pass characteristic and a signal delay substantially equal to the delay of a delay line employed in peaking signal formation. An additional feedback path is provided by the emitter-collector path of a clamping transistor that conducts in response to sync pulse appearances to readjust the charge on the input capacitor, clamping the sync pulse peaks to a potential selected to establish a desired coring depth for black scene regions. Amplifier gain is set to provide translator output swing establishing a desired minimum coring depth (e.g., zero) for peak white scene regions.

5 Claims, 2 Drawing Figures

DYNAMICALLY CONTROLLED HORIZONTAL PEAKING SYSTEM

The present invention relates generally to horizontal peaking systems for use in television receivers to enhance horizontal detail rendition in reproduced scenes, and particularly to horizontal peaking systems wherein coring of horizontal peaking signals is effected with a dynamic control of coring depth accurately associating a desired range of differing coring depths with the black-to-white gamut of the low frequency content of the video signals being peaked.

Coring of a signal (i.e., removing a close-to-average-axis "core" of the signal, by processing the signal with a translator exhibiting a transfer characteristic with a dead zone for close-to-axis signal excursions) is a known signal processing function, occasionally resorted to for noise reduction purposes, as explained, for example, in an article by J. P. Rossi, entitled "Digital Techniques for Reducing Television Noise", appearing on pages 134–140 of the March, 1978 issue of the SMPTE Journal. In certain uses of a coring circuit, a facility for adjusting the level of coring to be effected may be desired. The facility may permit manual adjustment of the coring level (as shown, for example, in an article by R. H. McMann, et al., entitled "Improved Signal Processing Techniques for Color Television Broadcasting", appearing on pages 221–228 of the March 1968, issue of the SMPTE Journal), or may provide for a dynamic adjustment of coring level (as shown, for example, in U.S. Pat. No. 4,167,749—Burrus, where a coring level is varied as a function of the level of noise detected as accompanying a video signal).

In a copending U.S. Pat. application Ser. No. 363,865 L. Harwood, et al., filed Mar. 31, 1982 and entitled "Adjustable Coring Circuit", a horizontal peaking system for a television receiver is disclosed wherein a facility is provided for adjustable coring of a horizontal peaking signal component to be added to received luminance signals for detail enhancement purposes. The coring of such a peaking signal component lessens the likelihood that undesired enhancement of background noise will accompany the desired picture detail enhancement.

In a copending U.S. Pat. application Ser. No. 373,750 of L. Cochran, concurrently filed herewith and entitled "Dynamic Coring Circuit", an approach to control of the coring of the horizontal peaking component in a system of the type disclosed in said Harwood, et al. patent application is suggested, wherein variation of the depth of coring effected is regulated in accordance with variations of the level of the low frequency content of the luminance signals to be peaked between black and white limits. The sense of the dynamic control proposed by Cochran is such that maximum coring is effected at the black extreme and minimum coring at the white extreme, in reliance on the observed phenomenon that low levels of background noise are more noticeable to a viewer when present in a dark portion of a viewed scene than when present in a bright portion thereof. Use of the Cochran system in controlling the depth of coring of a peaking signal component thus maximizes the protection against noise enhancement in those regions of a viewed scene where noise enhancement would be most objectionable and lessens the protection in those regions more tolerant of a higher noise level.

In implementation of the aforementioned dynamic coring control principles, uncertainty with respect to the DC levels associated with the black and white extremes of the luminance signals to be peaked may interfere with attainment of the optimum matching of a desired range of coring depths with the black-to-white swing of the low frequency content of the luminance signal. Pursuant to the principles of the present invention, a signal translator of relatively simple configuration is employed in development of the coring control voltage from a luminance signal input, with the translator configured to substantially ensure attainment of the desired range matching while also introducing a desired frequency response characteristic and control timing for the coring control action.

In accordance with an illustrative embodiment of the present invention, the signal translator employed for coring control voltage development includes a first transistor disposed as a common-emitter inverting amplifier. Luminance signals are coupled via a capacitor to the amplifier input. A frequency selective feedback network is disposed between amplifier output and input, imparting to the translator a low pass frequency response characteristic. A second transistor, of a conductivity type opposite to that of the first transistor, is disposed with its emitter electrode direct current conductively coupled to the amplifier output, with its collector electrode direct current conductively coupled to the amplifier input, and with its base electrode maintained at a reference DC potential. The polarity of the luminance signal input is such as to cause the (blacker-than-black) deflection synchronizing pulse components thereof to extend in a direction at the amplifier output that enhances conduction by the second transistor. The charge on the input capacitor is subject to a readjustment during conduction periods coinciding with sync pulse appearances that tends to clamp sync pulse peaks at a potential slightly offset from the reference potential. The reference potential is selected so that the coring control potential output developed in response to a black level input predictably introduces a coring depth appropriate for black scene regions.

Illustratively, the feedback network comprises a bridged-T filter providing a gradual high frequency roll-off for the signal translator, substantially precluding ringing disturbances of the coring control potential. The gain of the signal translator is such that the coring control potential output swings to a potential establishing a desired minimum coring depth in response to a peak white level input. Illustratively, the gain is set for this purpose by selection of a resistance ratio between an input coupling resistor disposed in series with the input capacitor, and feedback resistors serially disposed in the bridged-T network. In a preferred embodiment, the minimum coring depth corresponds to coring extinction (i.e., zero coring depth).

In an illustrative application of the present invention, the peaking signal former includes a delay line exhibiting a delay corresponding to a half period at a selected frequency within the high frequency portion of the spectrum occupied by the luminance signals. The (properly terminated) input end of the delay line receives luminance signals via a blocking capacitor coupled to the output of an adjustable gain luminance signal amplifier. The output end of the delay line is misterminated to obtain a reflective effect. A linear signal translating channel, responsive to the difference between the signals at the respective ends of the delay line, forms a horizontal peaking signal. Coring of the peaking signal is achieved by combining the output of the linear signal translating channel with the output of a nonlinear signal translating channel, also responsive to the difference between the signals at the respective ends of the delay line and providing a doubly clipped version thereof. Illustratively, the nonlinear signal translating channel takes the form of a multistage limiting amplifier with the distribution of gain between cascaded stages of the limiting amplifier subject to variation in accordance with changes of the coring control potential. Desirably, at the minimum coring extreme of the coring control potential variation range, a disabling of the limiting amplifier is effected, as shown for example, in the copending U.S. Pat. application Ser. No. 363,856 of R. Shanley, filed March 31, 1982 and entitled "Adjustable Coring Circuit Permitting Coring Extinction".

Illustratively, the adjustably cored horizontal peaking signal formed in the above-described manner is combined with the output of a linear luminance signal amplifier, responsive to signals at the output end of the delay line, to form a peaked luminance signal. The DC level at the delay line ends is desirably controlled by periodic readjustment of the charge on the blocking capacitor coupled to the delay line input end. This readjustment may be desirably effected in accordance with a control potential developed via a keyed comparison of the black level of the peaked luminance signal output with an appropriate reference potential, as shown, for example, in a copending U.S. Pat. application, Ser. No. 304,345, of R. Shanley, et al, now U.S. Pat. No. 4,386,369.

In such use of the present invention, the signal translator of the coring control potential development source is advantageously isolated from DC level variations that may be associated with the output of the variable gain luminance input amplifier, and with the inputs of the peaking signal former channels. Also, in such a use, the parameters of the feedback filter network are desirably selected so that the signal translator exhibits a delay substantially matching the delay imparted to the luminance signals by the aforementioned delay line.

Figure 1:
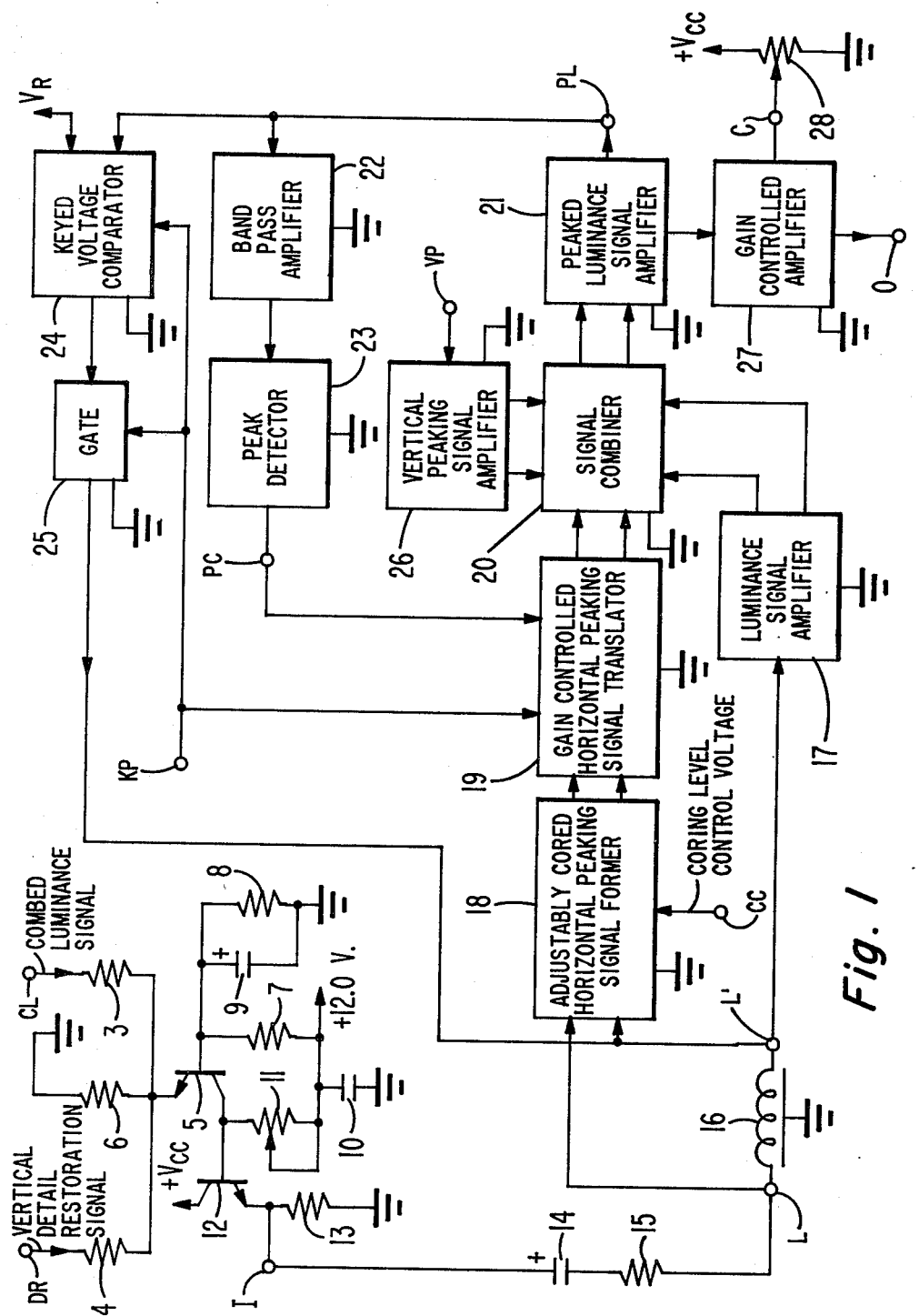
FIG. 1 illustrates, partially schematically and partially by block representation, a luminance channel of a color television receiver incorporating a peaking system in which dynamic coring control pursuant to the principles of the present invention may be advantageously practiced.

In FIG. 1, a portion of the luminance channel of a color television receiver is shown. Illustratively, the receiver is of the type employing a comb filter to separate the luminance and chrominance components of received composite color video signals, as shown, for example, in U.S. Pat. No. 4,096,516 - Pritchard. In such a receiver one of the outputs of the comb filter, comprising signals which have been subject to a filter characteristic exhibiting recurring nulls or minima at odd multiples of half the line frequency, constitutes a combed luminance signal, freed of accompanying chrominance signals but additionally suffering the loss of relatively low frequency vertical detail signals. Such a combed luminance signal appears at terminal CL in the FIG. 1 arrangement. Another of the outputs of the receiver's comb filter, comprising signals which have been subject to a filter characteristic exhibiting recurring nulls or minima at even multiples of half the line frequency, constitutes, when appropriately low pass filtered, a vertical detail restoration signal suitable for recombination with the combed luminance signal to reconstitute the received luminance signal. Such a vertical detail restoration signal appears at terminal DR in the FIG. 1 arrangement.

Signals from the respective terminals CL and DR are applied, via respective coupling resistors 3 and 4, to the emitter electrode of an NPN transistor 5, disposed as a common-base amplifier for the reconstituted luminance signals. The collector electrode of transistor 5 is connected to the positive terminal (+12.0 V.) of an operating potential supply by a load constituted by variable resistor 11, while the emitter electrode is returned to the (grounded) negative terminal of the supply via an emitter resistor 6. Bias for the base electrode of transistor 5 is developed by a voltage divider formed by resistors 7 and 8 serially disposed between said supply terminals, with the junction of the resistors directly connected to the base electrode. The base electrode of transistor 5 is bypassed to ground for signal frequencies by a capacitor 9 shunting divider resistor 8. An additional bypass capacitor 10 is coupled between the +12.0 V. terminal and ground.

Luminance signals appearing at the collector electrode of transistor 5 are coupled to a peaking system input terminal I via the base-emitter path of an NPN transistor 12 disposed as an emitter-follower. The emitter electrode of the emitter-follower transistor 12 is returned to ground via an emitter resistor 13, while the collector electrode of transistor 12 is directly connected to the positive terminal ($+V_{cc}$) of a second operating potential supply.

Luminance signals at terminal I are coupled via the series combination of a blocking capacitor 14 and a resistor 15 to the input terminal of a delay line 16. Illustratively, the resistance value of resistor 15 is chosen so as to terminate the input end of delay line with an impedance substantially matching the characteristic impedance of delay line 16. A luminance signal amplifier 17 responds to delayed luminance signals appearing at the output terminal (L') of delay line 16.

For horizontal peaking signal formation purposes, the output end of delay line 16 is desirably misterminated to obtain a reflective effect. The signals appearing at the respective ends of the delay line 16 are thus: (a) a once-delayed luminance signal at terminal L', and (b) the sum of an undelayed luminance signal and a twice-delayed luminance signal at terminal L. Illustratively, delay line 16 is a wideband device exhibiting a linear phase characteristic over the frequency band occupied by the luminance signals (e.g., extending to 4.0 MHz.) and provides a signal delay of 140 nanoseconds.

The difference between the respective signals at terminal L and L' corresponds to an appropriate horizontal peaking signal for addition to the luminance signal to enhance its horizontal detail by effectively boosting high frequency luminance components, with the maximum boost occurring at approximately 3.5 MHz. An adjustably cored version of such a peaking signal is formed by an adjustably cored horizontal peaking signal former 18, responsive to inputs from terminals L and L'. Illustrative structure for implementing the function of signal former 18 is shown in detail in FIG. 2, to be subsequently described. The depth of coring of the peaking signal developed by signal former 18 varies in accordance with a coring level control voltage applied to signal former 18 from a coring control terminal CC.

The adjustably cored horizontal peaking signal output of signal former 18 is supplied, illustratively in push-pull fashion, to a gain controlled horizontal peaking signal translator 19. The magnitude of the horizontal peaking signal output of translator is subject to variation in accordance with gain control inputs to translator 19 which will be subsequently described.

A peaked luminance signal is formed by a signal combiner 20 responsive to push-pull outputs of the luminance signal amplifier 17, and push-pull outputs of the horizontal peaking signal translator 19, and additionally responsive to push-pull outputs of a vertical peaking signal amplifier 26. The vertical peaking signal input supplied to amplifier 26 from the vertical peaking signal input terminal VP illustratively comprises vertical detail signals derived from the appropriate output of the receiver's comb filter and subjected to a non-linear signal translation in the manner described, for example, in U.S. Pat. No. 4,245,237—Lagoni.

A peaked luminance signal amplifier 21 responds to push-pull versions of the peaked luminance signals developed by signal combiner 20 and develops a single-ended output for delivery to a peaked luminance signal utilization terminal PL, and to the input of a gain controlled amplifier 27. For control of the contrast of scenes reproduced in response to the luminance signal output signal appearing at the output terminal 0 of amplifier 27, the gain of amplifier 27 is subject to variation in accordance with the magnitude of a potential supplied to a gain control input terminal C. Illustratively, the source of the contrast control potential is a potentiometer 28, with its fixed end terminals connected to respective terminals ($+V_{cc}$; ground) of an operating potential supply, and with its adjustable tap directly connected to terminal C.

The peaked luminance signal appearing at terminal PL is applied to the input of a bandpass amplifier 22 for automatic peaking control purposes. Illustratively exhibiting a passband of approximately 1 MHz. bandwidth centered about a frequency of approximately 2 MHz., amplifier 22 delivers the components of the peaked luminance signal falling within its passband to a peak detector 23, which develops a control voltage proportional to the amplitude of the delivered components. This control voltage is applied to a gain control input terminal PC of translator 19 to control the magnitude of the horizontal peaking signals supplied to combiner 20 in a sense opposing changes in the amplitude of said delivered components. Reference may be made to a copending U.S. Pat. application, Ser. No. 310,139, filed Oct. 9, 1981, for a more detailed explanation of the operation of such an automatic peaking control system, and examples of advantageous circuitry for implementing the functions of the elements 17, 19, 20, 21, 22, and 23 (as well as for associating a manual peaking control therewith).

The peaked luminance signal output of amplifier 21 appearing at terminal PL is also supplied as a first signal input to a keyed voltage comparator 24. A second signal input to comparator 24 is constituted by a reference potential $V_R$. Keying pulses, appearing at a keying pulse input terminal KP with a timing coinciding with a "backporch" portion of the horizontal blanking intervals of the luminance signals being processed, are supplied to a keying input of comparator 24, so that comparator functions to compare the black level of the peaked luminance signals with the reference potential. A gate 25, keyed into operation during the appearances of keying pulses at terminal KP, supplies the output of comparator 24 to terminal L' to effect a periodic readjustment of the charge on capacitor 14, the readjustment being in a sense reducing differences, if any, between the black level of the peaked luminance signals and the reference potential. Advantages of this type of feedback clamping system for regulation of the black level of the peaked luminance signal output are discussed in the aforementioned copending U.S. Pat. application, Serial No. 304,345. As also disclosed therein, for stability purposes (i.e., to avoid spurious oscillation development in the control loop), it is desirable to inhibit or strongly attenuate the signal output of the horizontal peaking signal channel during the voltage comparison periods. For this purpose, keying pulses from terminal KP are supplied to a second gain control input of the horizontal peaking signal translator 19, with the sense and magnitude of the applied keying pulses being such as to provide for sufficient attenuation of the translated horizontal peaking signals to substantially ensure freedom from undesired loop oscillations.

In operation of the FIG. 1 system, variable resistor 11 conveniently provides a facility for controlling the peak-to-peak swing of the luminance signals delivered to the peaking system input terminal. This facility is desirably used to set the swing magnitude so as to optimally utilize the breadth of the linear operating region for luminance amplifier 17. With such a setting, one is also assured that this signal swing will be accommodated within the linear signal handling range of a linear amplifier channel incorporated in the peaking signal former structure to be described subsequently in connection with FIG. 2. A consequence of the presence and aforesaid utilization of variable resistor, however, is variability of the DC levels associated with the black and white extremes of the luminance signals at terminal, with the absolute values thereof being dependent upon the magnitude of adjustment found to be necessary in a given receiver to establish the desired peak-to-peak swing.

Uncertainty as to the absolute DC values associated with the black and white extremes is also present with respect to the luminance signals at terminals L and L'. In operation of the feedback clamping system utilizing elements 24 and 25, charge adjustments on capacitor 14 must compensate for drifts, imbalances and other variations in signal processing stages intervening between terminals L and PL, with the result that the absolute DC values for the signal extremes at terminals L and L' will vary in dependence upon the particular compensation required to be effected.

Figure 2:
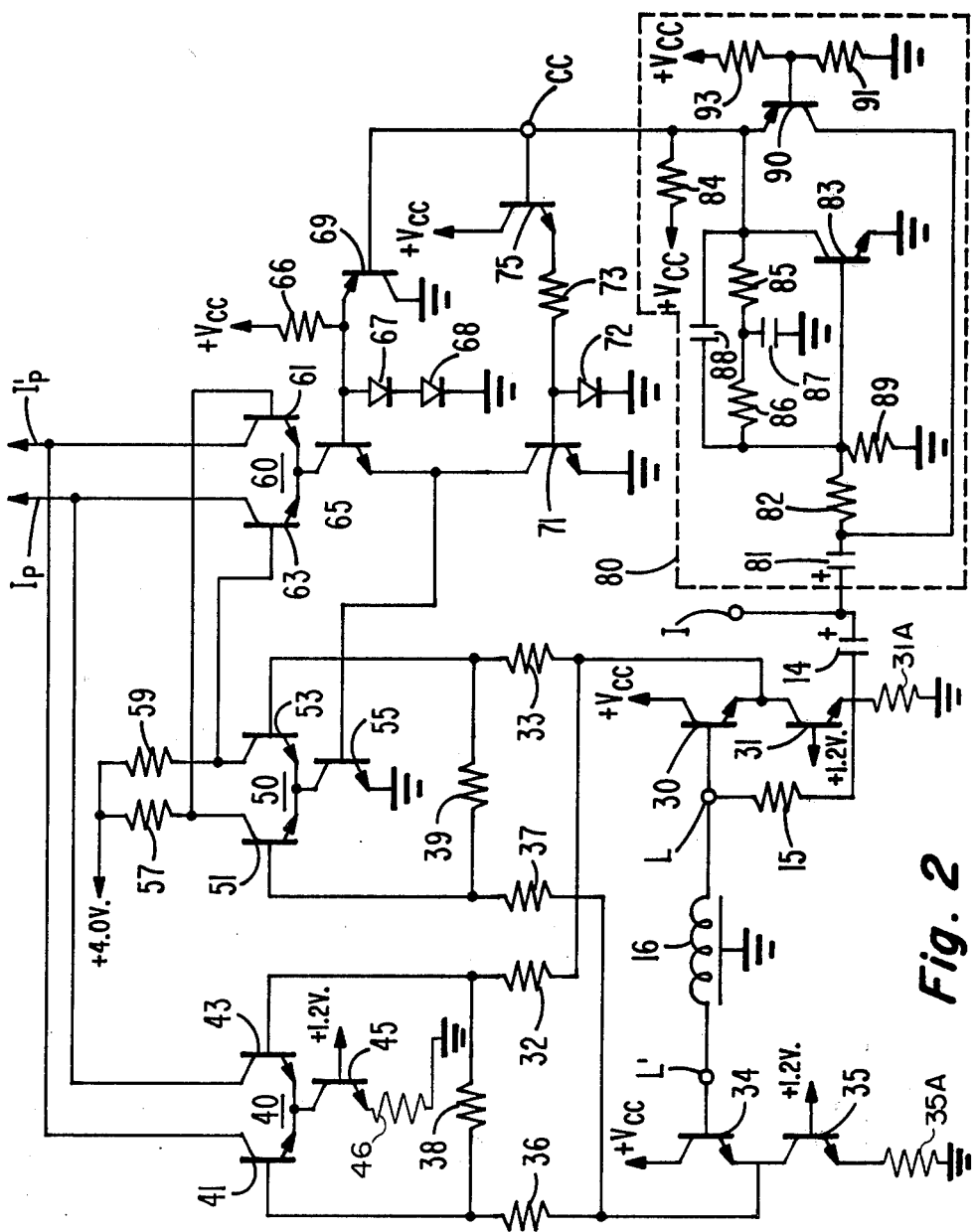
FIG. 2 illustrates schematically a portion of the peaking system of FIG. 1 subject to dynamic control by apparatus constructed in accordance with an illustrative embodiment of the present invention.

FIG. 2 illustrates circuitry for developing a coring level control voltage for application to the coring control terminal CC of the FIG. 1 system pursuant to the principles of the present invention. As explained subsequently, the circuitry allows predictable and accurate association of particular differing depths of coring with the black and white extremes (and level variations therebetween) of the low frequency content of the luminance input signals, despite the DC level uncertainties referred to above. Also shown in FIG. 2, in appropriate association with the control potential source, is particular circuitry which may be advantageously employed to implement the function of the peaking signal former 18 of the FIG. 1 system.

In FIG. 2, the showing of delay line 16, with its input and output terminals, L and L', respectively, and with its coupling via the series combination of terminating resistor 15 and blocking capacitor 14 to the peaking system input terminal I, is repeated from FIG. 1. As previously noted, the difference between the respective signals at terminals L and L' corresponds to an appropriate horizontal peaking signal for addition to the luminance signal to enhance its horizontal detail. A differential amplifier 40, accepting signals from terminals L and L' at its respective differential inputs, provides a linear amplification channel for such a peaking signal. Amplifier 40 includes a pair of NPN transistors 41, 43 with interconnected emitter electrodes returned to a point of reference potential (e.g., ground) via the collector-emitter path of an NPN current source transistor 45 in series with emitter-resistor 46. The base electrode of transistor 45 is connected to the positive terminal (+1.2 V.) of a bias potential supply to establish a desired operating current for amplifier 40.

Signals from terminal L' are supplied to the base electrode of transistor 41 via the base-emitter path of an NPN emitter-follower transistor 34 and a series coupling resistor 36. The collector electrode of transistor 34 is directly connected to the $+V_{cc}$ supply terminal, while the emitter electrode of transistor 34 is returned to ground via the collector-emitter path of a current source transistor 35 (with its base tied to +1.2 V. and its emitter grounded via resistor 35A). Signals from terminal L are supplied to the base electrode of transistor 43 via the base-emitter path of an NPN emitter-follower transistor 30 and a series coupling resistor 32. The collector electrode of transistor 30 is directly connected to the $+V_{cc}$ supply terminal, while the emitter electrode of transistor 30 is returned to ground via the collector-emitter path of a current source transistor 31 (with its base tied to +1.2 V. and its emitter grounded via resistor 31A). While direct connections are illustrated between the respective terminals L, L' and the bases of emitter-follower transistors 30, 34, additional emitter-followers (not shown) may desirably be interposed in the respective connections to elevate the impedances presented to the respective terminals.

A resistor 38 interconnects the base electrodes of transistors 41, 43, and cooperates with the coupling resistors 36, 32 to introduce a degree of attenuation of the input signals that ensures that the maximum signal difference between base potentials is accommodated within the linear signal handling range of amplifier 40. The respective collector electrodes of transistors 41 and 43 are linked to the positive terminal of an operating potential supply by respective loads (not shown) which are shared by the outputs of a limiting amplifier to be subsequently described. The respective collector currents of transistors 41 and 43 vary in accordance with oppositely phased versions of the peaking signals.

A differential amplifier 50, accepting signals from terminals L and L' at its respective differential inputs, serves as the input stage of a limiting amplifier providing a non-linear amplification channel for the peaking signal. Amplifier 50 includes a pair of NPN transistors 51, 53 with interconnected emitter electrodes returned to ground via the collector-emitter path of an NPN current source transistor 55. Signals from terminal L', appearing at the output of emitter-follower transistor 34, are supplied to the base electrode of transistor 51 via a series coupling resistor 37. Signals from terminal L, appearing at the output of emitter-follower transistor 30, are supplied to the base electrode of transistor 53 via a series coupling resistor 33. A resistor 39 interconnects the base electrodes of transistors 51 and 53. The input signal attenuation provided by the network of resistors 37, 39, 33 is less than the attenuation provided by the linear amplifier network (36, 38, 32), and permits the maximum signal swing between bases to exceed the linear signal handling range of amplifier 50.

The collector electrodes of transistors 51 and 53 are individually connected by respective load resistors (57, 59) to the positive terminal (+4.0 V.) of an operating potential supply. Oppositely phased peaking signals (with maximum excursions clipped) appear across the respective load resistors 57 and 59.

Differential amplifier 60, serving as the output stage of the limiting amplifier and providing further clipping of the peaking signals, includes a pair of NPN transistors 61 and 63 with interconnected electrodes connected to the collector electrode of a current source transistor 65. The emitter electrode of transistor 65 is returned to ground via the base-emitter path of current source transistor 55. The base electrode of transistor 61 is directly connected to the collector electrode of transistor 51 of the input stage, while the base electrode of transistor 63 is directly connected to the collector electrode of transistor 53 of the input stage.

The collector electrode of transistor 61 is directly connected to the collector electrode of transistor 41 of the linear amplifier so that the summed collector currents of transistors 41 and 61 form a cored peaking signal current (Ip'). The collector electrode of transistor 63 is directly connected to the collector electrode of transistor 43 of the linear amplifier so that the summed collector currents of transistors 43 and 63 form a cored peaking signal current Ip (an oppositely phased version of Ip').

A resistor 66 is connected between the positive terminal (+3.2 V.) of a bias potential supply and the anode of a diode 67, the cathode of which is directly connected to the anode of a second diode 68. The cathode of diode 68 is directly connected to ground, so that the pair of diodes 67, 68 are forward biased by the bias potential supply. The anode of diode 67 is directly connected to the base electrode of current source transistor 65, so that the voltage appearing across the diode pair (67, 68) is applied across the serially disposed base-emitter paths of current source transistors 65, 55 to forward bias their base-emitter junctions.

The collector electrode of an NPN control transistor 71 is directly connected to the base electrode of transistor 55. The emitter electrode of transistor 71 is directly connected to ground, disposing the collector-emitter path of control transistor 71 directly in shunt with the base-emitter path of the input stage's current source transistor 55.

The coring control input terminal CC is connected to the base electrode of an NPN emitter-follower transistor 75 (having its collector electrode directly connected to the $+V_{cc}$ supply terminal). The emitter electrode of transistor 75 is connected via resistor 73 to the base electrode of transistor 71, and to the anode of a diode 72. The cathode of diode 72 is directly connected to ground, disposing diode 72 directly in shunt with the base-emitter path of control transistor 71. A positive coring control voltage applied to terminal CC (from the coring level control voltage source 80) controls the biasing of transistor 71 to vary the conductance of its collector-emitter path. The variable coring control voltage at terminal CC is also applied to the base electrode of a PNP control transistor 69. The emitter electrode of control transistor 69 is directly connected to the base electrode of current source transistor 65, and the collector electrode of control transistor 69 is directly connected to ground, thus disposing the emitter-collector path of transistor 69 in shunt with the serially connected diode pair 67, 68.

Over a substantial portion of the range of variations of the coring control potential applied to terminal CC, the base-emitter junction of the PNP control transistor 69 is reverse biased. Under such circumstances, transistor 69 is cut off and has no effect on the operation of the adjustable coring circuit, which functions in a manner as described in the aforementioned copending Harwood, et al. patent application entitled "Adjustable Coring Circuit", and as summarized immediately below.

The base-emitter path of transistor 65 forms a voltage divider with the parallel combination of (a) the base-emitter path of transistor 55, and (b) the collector-emitter path of the NPN control transistor 71, to effect a division of the bias voltage appearing across the series-connected diodes 67, 68, with the division ratio dependent upon the conductance of transistor 71. When the shunting impedance presented by transistor 71 decreases (due to an increase in the positive coring control voltage), the base-emitter voltage ($V_{be}$) of current source transistor 55 decreases, accompanied by a complementary increase of the base-emitter voltage of current source transistor 65. When the shunting impedance presented by transistor 71 increases (due to a decrease in the positive coring control voltage), the $V_{be}$ of transistor 55 increases, accompanied by a complementary decrease of the $V_{be}$ of transistor 65.

The consequence of a variation of the coring control voltage is thus an introduction of complementary variations in the operating currents of differential amplifiers 50 and 60, and, hence, complementary variations of the respective gains of the two cascaded stages of the limiting amplifier. With variations of the DC impedance presented by the NPN control transistor 71 having a negligible effect on the bias voltage appearing across diodes 67, 68, the overall gain of the limiting amplifier, proportional to the product of the magnitudes of the respective stage's operating current, remains substantially undisturbed as the distribution of gain between respective stages is varied. For accuracy of coring, this undisturbed magnitude of overall gain is set so that the gains of the respective non-linear and linear amplification channels are substantially identical.

A gain distribution change (caused by a decrease in coring control voltage) that elevates input stage (50) gain results in a clipping by the output stage (60) that is closer to the axis, and thus reduces the coring level. Conversely, a gain distribution change (caused by an increase in coring control voltage) that depresses input stage gain increases the coring level.

The role performed by the PNP control transistor 69 is confined to the end of the coring control potential variation range associated with a minimum coring level, as explained, for example, in the aforementioned U.S. Pat. application of R. L. Shanley, entitled "Adjustable Coring Circuit Permitting Coring Extinction". When the potential at the coring control terminal CC falls sufficiently close to ground potential, the biasing of the base-emitter junction of PNP control transistor shifts to a forward direction. For terminal CC potentials below approximately +0.7 volts, transistor 69 is rendered conducting, and for terminal CC potentials below approximately +0.5 volts, the conduction by transistor 69 is sufficient to drive current source transistors 55, 71 into cutoff, disabling the limiting amplifier and fully extinguishing coring action. The adjustable coring circuit is thereby provided with a zero coring level for one extreme of the coring level control range.

Attention is now directed to the circuitry of the coring level control voltage source 80. The input to the coring level control voltage source 80 comprises luminance signals which illustratively appear at the peaking system input terminal I with such a polarity that the (blacker-than-black) deflection synchronizing pulse components thereof extend in a negative direction. Signals from terminal I are applied via the series combination of a blocking capacitor 81 and a resistor 82 to an NPN transistor 83 for amplification thereby, with capacitor 81 and resistor 82 coupled, in the order named, between terminal I and the base electrode of transistor 83. The emitter electrode of transistor 83 is returned directly to ground, while the collector electrode of transistor 83 is connected via a load resistor 84 to the operating potential supply terminal $+V_{cc}$. A resistor 89 directly shunts the base-emitter path of transistor 83.

Feedback between the collector and base electrodes of transistor 83 is provided via a bridged-T filter network formed by a pair of resistors 85 and 86 connected in series between said collector and base electrodes, a capacitor 88 connected in shunt with the series combination of resistors 85, 86, and a capacitor 87 connected between ground and the junction of the serially disposed resistors 85, 86.

A PNP transistor 90, performing a feedback clamping action, has its emitter electrode directly connected to the collector electrode of amplifying transistor 83, and its collector electrode directly connected to the junction of capacitor 81 and resistor 82. The series combination of a pair of resistors 91, 93 is connected between ground and the $+V_{cc}$ terminal to form a voltage divider, which develops a reference DC potential at the junction of resistors 91, 93 for direct application to the base electrode of the clamping transistor 90.

The described circuitry forms an inverting signal translator for the input luminance signals which exhibits a low pass frequency response characteristic and provides a signal delay appropriate for substantial matching with the delay imparted by delay line 16. For an illustrative set of circuit parameters (set forth in a listing below), the high frequency roll-off of the frequency response characteristic is desirably gradual with the cut-off frequency ($-3$ db. point on the characteristic) falling at approximately 1.05 MHz.

In operation of the disclosed circuitry for source 80, capacitor 81 isolates the signal translator from the previously mentioned variations of DC level at terminal I, that may be a consequence, for example, of signal swing adjustments effected through use of variable resistor 11 (FIG. 1). A DC restoring action is performed by clamping transistor 90, which is normally periodically driven into conduction during sync pulse appearances. The charge on capacitor 81 is subject to a readjustment during these conduction periods that tends to clamp sync pulse peaks of the translator output at a potential determined by the reference potential developed by the voltage divider 93, 91 (and slightly offset therefrom).

The reference potential is selected so that the translator output potential (at terminal CC) developed in response to a black level input introduces a desired coring depth (e.g., 6%). The gain of the signal translator, as determined by the ratio of the resistance value of resistor 82 and the sum of the resistance values of resistors 85 and 86, is selected so that the black-to-white signal swing for the translator output potential at terminal CC provides the desired gamut of coring depth variations. Illustratively, the gain selection is such that a zero coring level is reached for white levels beyond 70 to 80 IRE units.

A "soft" clamping action is provided in the described circuit, with clamping transistor 90 subject to keying by the signal itself (i.e., there being no external keying provided). For certain scene transitions, conduction by transistor 90 may be precluded for several line periods. These transient conditions have been found, however, to be tolerable, wherefore the added complexity and expense of external keying may conveniently be avoided.

An illustrative set of values for circuit parameters of the FIG. 2 system is, as follows:

Resistor 15: 680 ohms
Resistors 32, 36: 2.4 kilohms
Resistors 33, 37: 470 ohms
Resistor 38: 1000 ohms
Resistor 39: 4.7 kilohms
Resistors 57, 59, 46: 500 ohms
Resistor 66: 13.3 kilohms
Resistor 73: 25 kilohms
Potential ($+V_{cc}$): 11.2 volts
Capacitor 14: 1 microfarad
Capacitor 81: 33 microfarads
Resistors 82, 31A, 35A: 2 kilohms
Resistors 85, 86: 5.6 kilohms
Resistor 84: 1.8 kilohms
Resistor 89: 3.3 kilohms
Resistor 91: 3 kilohms
Resistor 93: 8.2 kilohms
Capacitor 87: 22 picofarads
Capacitor 88: 15 picofarads

What is claimed is:

1. In a television receiver including a source of video signals which are representative of variations of the luminance of an image between black and white extremes during periodic image intervals, and which include, during intervening blanking intervals, deflection synchronizing pulses extending to peaks at a blacker-than-black level, said video signals occupying a predetermined band of frequencies; a dynamically controlled horizontal peaking system comprising:

a peaking system input terminal;
means, coupled to said source, for delivering said video signals to said peaking system input terminal;
means, responsive to said delivered video signals, for forming an adjustably cored horizontal peaking signal output, said forming means having a coring level control terminal, with the depth of coring of said horizontal peaking signal output effected by said forming means being dependent upon the level of a potential appearing at said control terminal;
signal translating means having an input terminal and an output terminal, and exhibiting a low pass characteristic having a cutoff frequency lying below the middle of said band of frequencies;
a direct current conductive coupling between said output terminal and said control terminal;
a capacitor coupled between said input terminal of said signal translating means and said peaking system input terminal;
means for developing a reference potential at a reference terminal;
a transistor having a base electrode direct current conductively coupled to said reference terminal, an emitter electrode direct current conductively coupled to said output terminal of said signal translating means, and a collector electrode direct current conductively coupled to said input terminal of said signal translating means; and
a signal combiner, responsive to said delivered video signals and to said adjustably cored horizontal peaking signal output, for developing peaked luminance representative signals;
wherein said signal translating means provides a filtered version of said video signals at said output terminal with a polarity such that said synchronizing pulses extend in a conduction-enhancing direction for said transistor.

2. Apparatus in accordance with claim 1 wherein said forming means comprises:

a delay line having an input end capacitively coupled to said peaking system input terminal to receive said delivered video signals and terminated in an impedance substantially matching the characteristic impedance of said delay line, and having a misterminated output end;
means, coupled to said input and output ends, for linearly amplifying the difference between signals appearing at said input and output ends of said delay line; and
a limiting amplifier, coupled to said input and output ends, for nonlinearly amplifying said signal difference; said limiting amplifier comprising a plurality of amplifying stages in cascade, with the distribution of gain between said stages subject to variation in accordance with the level of said potential appearing at said control terminal; and wherein
said signal translating means imparts a delay to said filtered version of said video signals substantially equal to the delay imparted to said delivered video signals by said delay line.

3. Apparatus in accordance with claim 2 wherein said forming means also includes means, responsive to the potential appearing at said control terminal, for disabling said limiting amplifier, to substantially extinguish the coring of said horizontal peaking signal, when the level of the potential at said control terminal drops below a predetermined threshold value; and
wherein said reference potential is of such a value that periodic conduction by said transistor tends to maintain the potential at said control terminal during said synchronizing pulse peaks at a level sufficiently above said predetermined threshold value as to establish a predetermined finite level of coring when said filtered video signals are representative of said black extreme and lesser levels of coring for departures therefrom in the white direction.

4. Apparatus in accordance with claim 3, said video signal delivering means includes means for adjusting the peak-to-peak swing of said delivered video signals, and wherein the adjusted magnitude of said delivered video signals is such as to (a) contain the maximum swing of said signal difference within the linear signal handling range of said means for linearly amplifying said signal difference, and (b) cause the level of said potential at said control terminal to lie below said predetermined threshold value when said filtered video signals are representative of said white extreme.

5. Apparatus in accordance with claims 1 or 4, wherein said signal translating means includes:
a resistor;
a second transistor having base, emitter and collector electrodes, and disposed as a common-emitter amplifier responsive to video signals coupled to its base electrode via the series combination of said capacitor and said resistor;
a pair of additional resistors serially connected between said collector and base electrodes of said second transistor;
a second capacitor connected in shunt with said serially connected pair of additional resistors; and
a third capacitor connected between a point of reference potential and the junction of said additional resistors of said pair; and
wherein said first-named and said second transistors are of mutually opposite conductivity types.

* * * * *